United States Patent [19]
Brière

[11] Patent Number: 4,586,239
[45] Date of Patent: May 6, 1986

[54] PROCESS OF MANUFACTURING A HIGH-FREQUENCY VERTICAL JUNCTION FIELD-EFFECT TRANSISTOR

[75] Inventor: Pierre Brière, Rueil Malmaison, France

[73] Assignee: Thomson-CSF, Paris, France

[21] Appl. No.: 625,256

[22] Filed: Jun. 27, 1984

[30] Foreign Application Priority Data

Jun. 30, 1983 [FR] France ............... 83 10909

[51] Int. Cl.$^4$ ............... H01L 21/74; H01L 29/80
[52] U.S. Cl. ............... 29/571; 29/576 B; 29/578; 148/1.5; 357/22
[58] Field of Search ............... 29/571, 576 B, 578; 148/1.5; 357/22

[56] References Cited

U.S. PATENT DOCUMENTS

| 4,198,645 | 4/1980 | Nishizawa | 357/22 |
| 4,261,763 | 4/1981 | Kumar et al. | 29/576 W |
| 4,326,269 | 4/1982 | Nishizawa | 357/22 |
| 4,381,956 | 5/1983 | Lane | 29/576 B |
| 4,403,396 | 9/1983 | Stein | 29/576 B |

FOREIGN PATENT DOCUMENTS

| EP38239 | 10/1981 | European Pat. Off. | |
| 2296263 | 12/1974 | France | 357/22 V |
| 58484 | 5/1977 | Japan | 357/22 V |

Primary Examiner—Brian E. Hearn
Assistant Examiner—Hunter L. Auyang
Attorney, Agent, or Firm—Cushman, Darby & Cushman

[57] ABSTRACT

According to this process, P+ type parallel bars are implanted in a N type silicon substrate. Thereafter an oxidation above the implanted zones is carried out, then a uniform layer of polycrystalline silicon is deposited that contacts the N type silicon substrate by being directly isolated from the P+ type grid bars.

The present invention allows to manufacture particularly miniaturized vertical junction field-effect transistor structures by a simple process.

3 Claims, 15 Drawing Figures

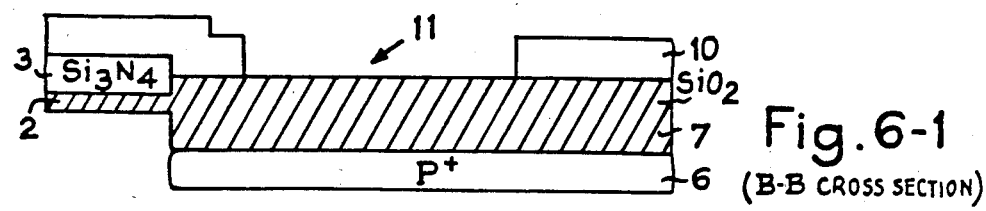
Fig. 6-1 (B-B CROSS SECTION)
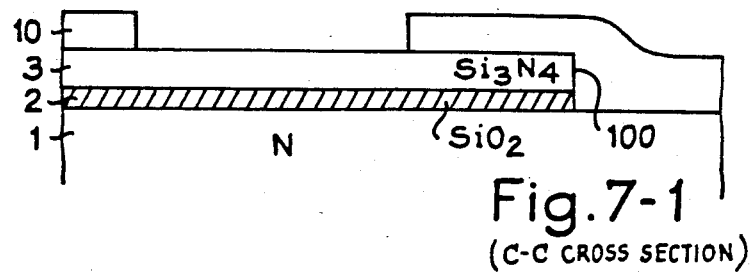
Fig. 7-1 (C-C CROSS SECTION)
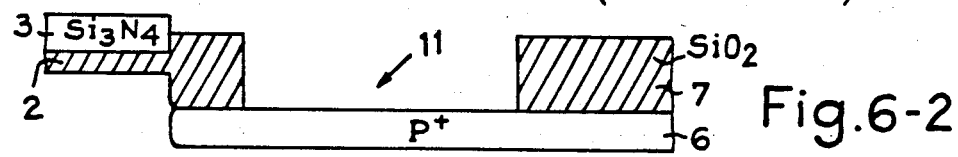
Fig. 6-2
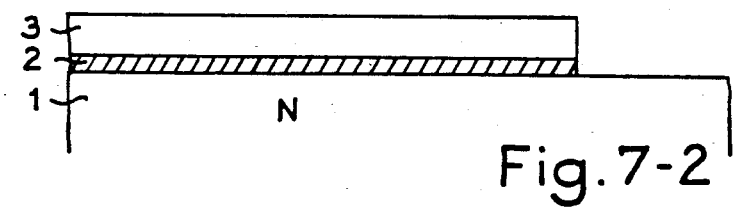
Fig. 7-2
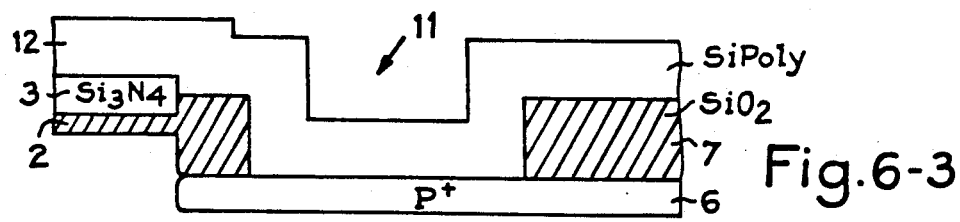
Fig. 6-3
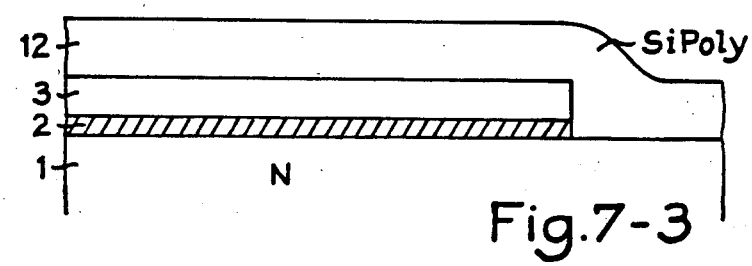
Fig. 7-3

PROCESS OF MANUFACTURING A HIGH-FREQUENCY VERTICAL JUNCTION FIELD-EFFECT TRANSISTOR

BACKGROUND OF THE INVENTION

Field of the Invention

The present invention concerns a process for the manufacture of a high-frequency junction vertical field-effect transistor. It concerns more particularly a transistor of this type comprising a grid constituted of parallel pins of a second type of conductivity embedded or implanted in the upper surface of a subtrate of a first type of conductivity. The upper surface of the subtrate is integral with a source electrode. The lower surface is integral with a drain electrode and a grid contact is provided at the ends of the embedded pins or bars.

The first vertical junction field-effect transistors have, to the applicant's knowledge, been described in French patent published under No. 1.163.241 filed Dec. 10, 1956 by Stanislas Teszner. Since this first description of a vertical field-effect transistor, numerous structures have been described to allow the miniaturization of vertical field-effect transistors and/or the decrease of the access resistance to the grid.

One object of the present invention is to provide a manufacturing process allowing to achieve a particularly miniaturized structure while avoiding the need for steps taking place at high temperature so as to prevent an extension by diffusion of the embedded grid zones.

To achieve this object as well as others, the present invention provides a process for manufacturing a high frequency vertical junction field effect transistor comprising an embedded grid constituted by parallel bars comprising steps consisting of: successively depositing on a silicon substrate of a first type of conductivity silicon oxide layers of a first thickness, silicon nitride and resin layers, and in successively attacking these layers according to an arrangement of parallel bars; implanting a doping impurity of the second type of conductivity masked by the three above layers with an energy such that it is implanted at a certain depth in the substrate, then in removing the resin; in causing to grow at low temperature, for example under high pressure, an oxide layer on the bare silicon, this oxide layer having a second thickness more important than the first and contacting the implanted zone; exposing the ends of the bars of the second type of conductivity, removing the silicon nitride and attacking the silicon oxide on a thickness corresponding to the first thickness; depositing a layer of polycrystalline silicon and separating this layer into two zones of which one, in contact with the substrate zones of the first type of conductivity, is doped according to the first type of conductivity and the other, in contact with the ends of the bars of the second type of conductivity is doped according to this second type of conductivity.

Other aspects of the present invention reside in the manner in which the polycrystalline silicon layer is divided into two zones and in the manner in which the grid contact is taken with the ends of the implanted bars. These other aspects of the invention will be set out in the following description of particular embodiments of the invention.

BRIEF DESCRIPTION OF THE DRAWINGS

These objects, characteristics and advantages as well as others of the present invention will be set out hereinunder in detail with relation to particular embodiments in the following description given with reference to the annexed figures in which.

The figures have the sole purpose of supporting the description and are not to scale neither in their vertical dimensions, nor in their horizontal dimensions. Furthermore, no scale is respected from one group of figures to another.

In the following description, a N type silicon substrate on which is formed an embedded P+ type grid will be considered. Nevertheless, what is important is that the bars are of the conductivity type opposite to that of the substrate, this being able to be of the P type and the bars of the N type.

DETAILED DESCRIPTION OF THE DRAWINGS

Figure 1:
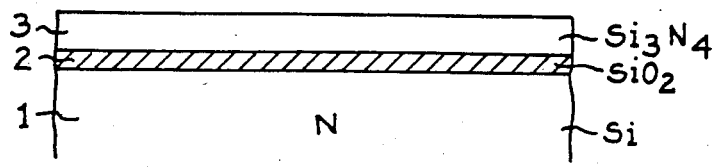
FIGS. 1 to 4 are section views along a plane perpendicular to the embedded grid bars illustrating successive manufacturing steps of a junction field-effect transistor according to the present invention.

FIG. 1 represents a section view of a structure according to the present invention along a plane perpendicular to the pins or bars of the grid to be formed. FIG. 1 represents the initial structure constituted by an N type silicon substrate 1 covered with a thin silicon oxide layer 2, itself covered with a layer 3 of silicon nitride. The silicon oxide layer presents, for example, a thickness of about several hundred angstroms and the silicon nitride layer a thickness of about 500 to 1500 angstroms.

Figure 2:
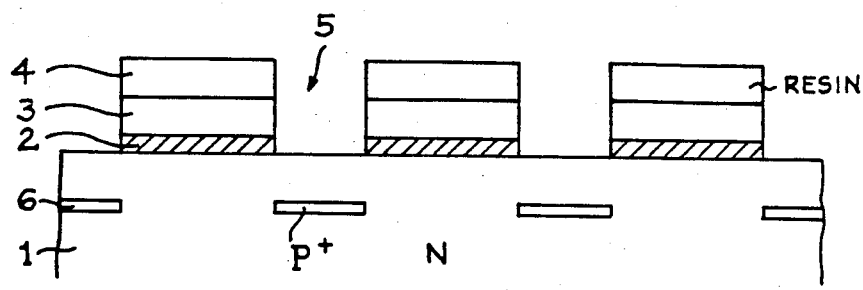

As represented in FIG. 2, this structure is thereafter coated with a resin layer 4 open in sites 5 disposed according to parallel bars. From the openings in the resin layer 4, corresponding openings have been cut into the silicon nitride layer 3 and in the thin silicon oxide layer 2 and an implantation of P type doping ions is carried out in such a way as to obtain P+ type implanted zones 6. This implantation is realized with high energy so that the implanted zones 6 are at a certain depth below the silicon surface, for example, from 0.3 to 0.5 microns.

Figure 3:
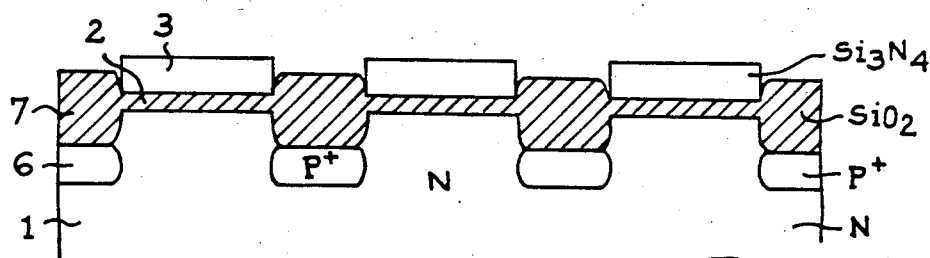

As represented in FIG. 3, the resin layer 4 is thereafter removed and an oxidation step is carried out. According to one important characteristic of the present invention, this oxidation step must be carried out under high pressure to be able to be realized at low temperature of about 500° to 700° C. During this step, the zones corresponding to the openings 5 are oxidized while the zones present under the portions of the nitride layer 3 remaining in place are protected from any oxidation. Thus, after this step, doped P+ type embedded bars 6 parallel to one another are obtained, each implanted bar being covered with a corresponding bar of silicon oxide 7. This oxidation step is carried out so that the thickness of the oxide bar 7 is clearly superior to the thickness of the thin oxide layer 2 and that this oxide bar contacts the P+ type embedded bar 6. By way of numerical example, the depth of the oxide bar underneath the surface of the silicon substrate can be about 0.3 micron, the total thickness of this oxide bar being about 0.6 micron; the openings 6 can have a width of about 1 micron and can be disposed at an interval as low as about 3 microns.

Figure 4:
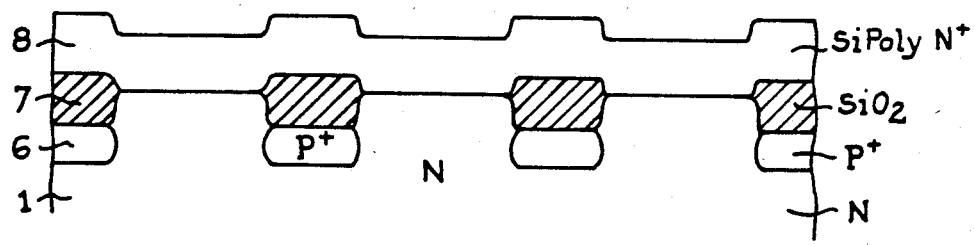

Thereafter, as represented in FIG. 4, the removal of the nitride layer 3 is carried out (this step being made through a mask maintaining the nitride above the ends of the bars as will be set out herein-below), then the removal of the thin oxide layer 2 is carried out, for example, by chemical attack of sufficient duration to remove the thin oxide layer 2 while only removing a part of the thickness of the oxide bars 7. After these steps, as can be seen from the view from above, the oxide bars are separated from one another by apparent exposed N type silicon surfaces. A polycrystalline silicon layer 8 that will be N+ type doped is thus deposited to ensure the ohmicity of the contact with the N type substrate. One of the interests in providing a contact through this N+ type silicon layer rather than carrying out a direct metallization deposit lies in the fact that, if a metallization is deposited, it would be appropriate to superficially overdope the N type substrate and therefore to lose part of the advantage of the sinking of the P+ type bars.

Figure 5:
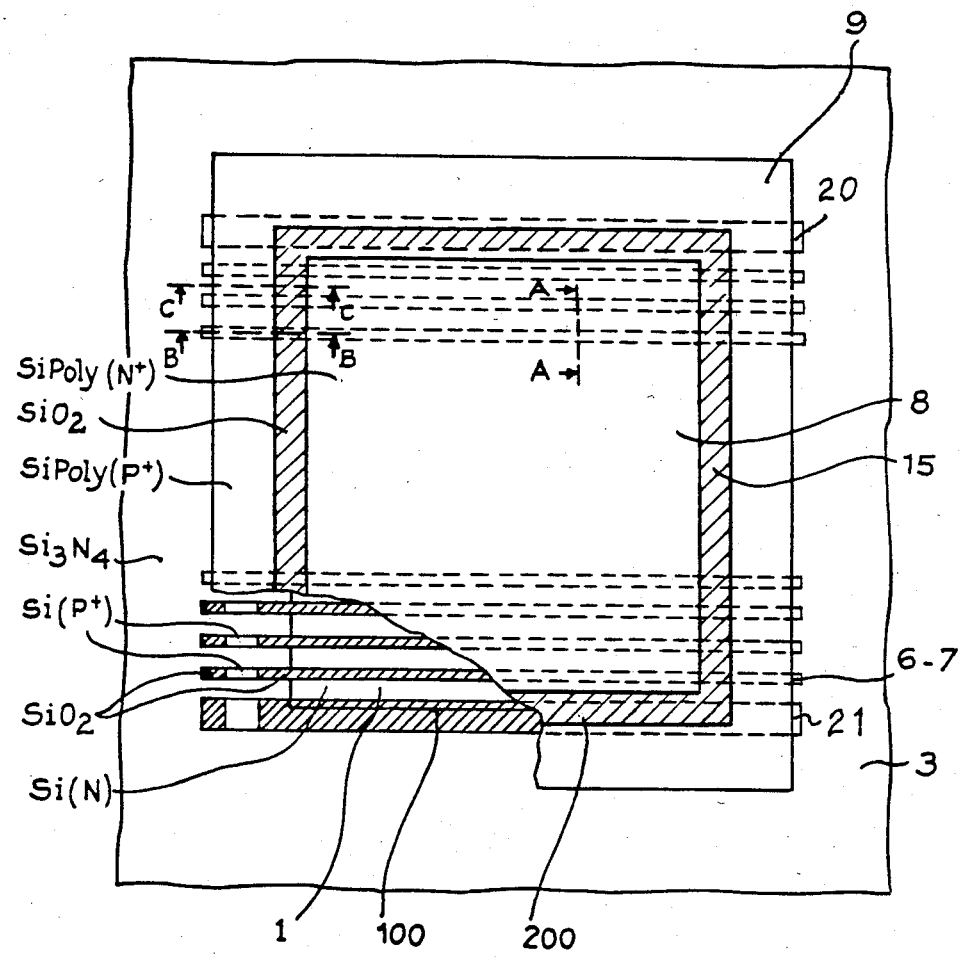
FIG. 5 represents a view from above, partially torn away of a structure obtained by the process according to the present invention.

FIG. 5 represents a view from above of the device according to the present invention at a practically final manufacturing state. The references that are indicated are those already given in FIGS. 1 to 4, previously described herein-above, and those which will be indicated herein-below during the description of FIGS. 6.1 to 6.5 and 7.1 to 7.5. For the moment, this figure is mentioned simply to indicate the various section planes corresponding to the other figures.

FIGS. 1 to 4 described herein-above correspond to a section A—A along a plane perpendicular to the substrate and to the general direction of the bars.

Figures 4, 6:
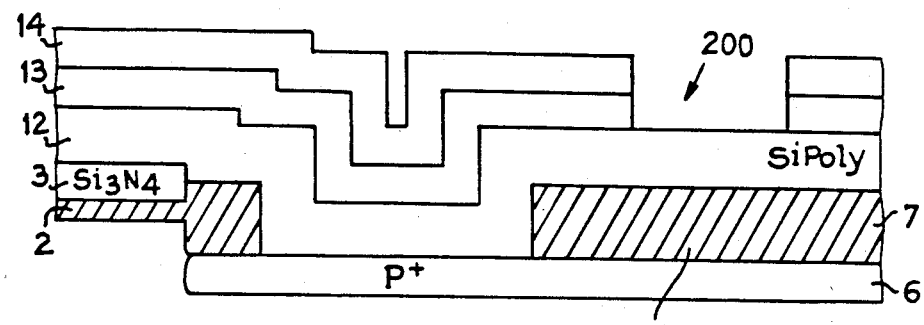
FIGS. 6.1 to 6.5 and 7.1 to 7.5 are sectional views along a plane parallel to the general direction of the bars at the ends of these bars, respectively inside one bar and between two bars.
Figures 4, 7:
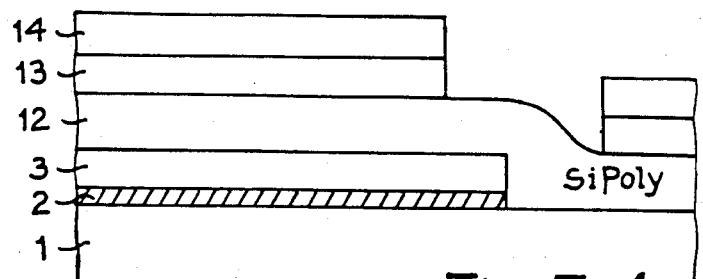
Figures 5, 6:
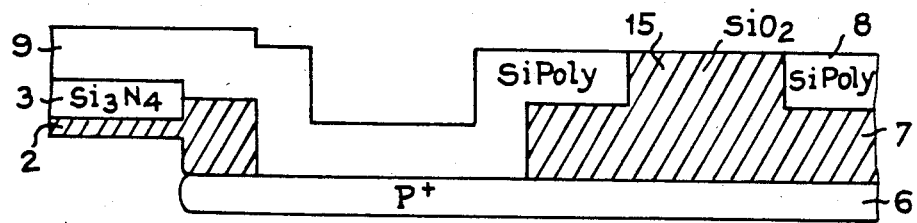
Figures 5, 7:
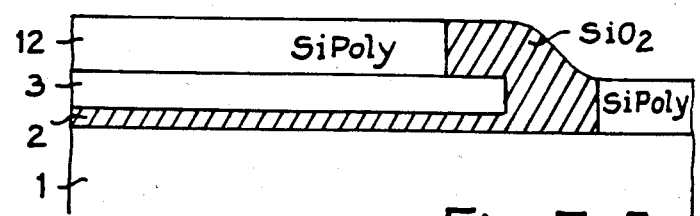

FIGS. 6.1 to 6.5 correspond to section B—B, i.e. to a section realized in an end zone of the bar, perpendicular to the substrate plane and parallel to the general direction of the bars, while the section C—C that corresponds to FIGS. 7.1 to 7.5 is taken according to a plane parallel to that of the section B—B but between two bars.

At the step illustrated in FIGS. 6.1 and 7.1, operating proceeds from the state of the structure illustrated in FIG. 4, but prior to the deposit of the polycrystalline silicon layer 8. The silicon nitride layer 3 has been removed by using a mask, leaving in place this silicon nitride layer at the periphery. The limit of this mask is illustrated by the reference 100 in FIG. 5 in the part of this figure where the polycrystalline silicon layer has been removed. This mask 100 is also designed so as to extend up to either side on end bars 20 and 21. As shown in FIG. 5, these end bars can possibly be wider than the others in order to simplify the technological operations. From this state, a resin layer 10 is deposited, open along the outline of a frame 11 that can be limited to two parallel strips perpendicular to the general direction of the bars at their ends. Above the bars, this opening 11 in the resin issues onto the thick silicon dioxide layer in the form of bar 7 (FIG. 6.1) and, between the bars, the opening 11 issues onto the silicon nitride layer 3 (FIG. 7.1).

Thereafter, an etching step is carried out using a product that selectively attacks the silicon dioxide. The silicon layer 7 is thus open above the P+ type bars 6 (FIG. 6.2), whereas no attack is produced between the bars (FIG. 7.2) since the apparent layer at this place is a silicon nitride layer 3. FIGS. 6.2 and 7.2 represent the state of the structure after removal of the resin layer 10.

After these steps, a polycrystalline silicon layer designated by the reference 12 in FIGS. 6.3 and 7.3 and by reference 8 in FIG. 4 is uniformly deposited. At the level of the opening 11, this polycrystalline silicon layer is in contact with P+ type bars 6.

After this, the polycrystalline silicon layer 12 is divided into two parts: a central portion corresponding to the source electrode 8 and a peripheral portion, closed or not, corresponding to the grid electrode and being disposed, for example, in the form of a frame about the source electrode portion. In order to do this, a silicon nitride layer 13 (possibly with interposition of a thin layer of silicon oxide) is deposited on the structure over the polycrystalline silicon layer 12. This silicon nitride layer is itself covered with a resin layer 14 and is opened according to a peripheral window 200 close to the limit of mask 100 defined herein-above, and for example on either side of this limit, layers of resin and silicon nitride (see FIGS. 6.4 and 7.4 as well as FIG. 5 for the limit of mask 200). The silicon nitride layer 13 is used to delimit an oxidation zone of the polycrystalline silicon layer 12 and is obtained, as represented in FIGS. 5, 6.5 and 7.5, electrically separated polycrystalline silicon zones 8 and 9, the separation zone being constituted by silicon oxide resulting from the polycrystalline silicon oxidation, this separation zone, delimited by the mask 200, being designated by the reference 15.

After this, by complementary maskings, the polycrystalline silicon zones 8 and 9 are respectively N+ type and P+ type doped. Then, in a classic manner, the following is carried out:
- a superficial oxidation of the polycrystalline silicon layers 8 and 9,
- an opening of contact zones,
- a deposit, then an opening of metalization,
- an isolating protection deposit, for example, of silica or silicon nitride, and
- an opening of connection pads.

The view from above of FIG. 5 will now be better understood. FIG. 5 corresponds to the state of the structure following the steps illustrated in FIGS. 6.5 and 7.5 and in which the upper polycrystalline silicon layer is partially torn away at the lower left-hand part of the figure. The central layer 8 of polycrystalline silicon is in contact with the upper surface of the substrate 1 and passes on the oxided bars 7 on top of the grid bars 6. The external polycrystalline silicon layer 9 separated from the central layer 8 by the oxidized frame 15 lies on the silicon nitride layer 3 between the bars and on the P+ type doped bars 6 at the sites of the openings 11 towards these bars. Of course, this polycrystalline silicon layer 9 is limited towards the outside by an adequate masking forming part of the mask 200 intervening during the step illustrated in FIGS. 6.5 and 7.5. Since in the subsequent steps, the polycrystalline silicon layers 8 and 9 are superficially oxidized, then contacts are provided for the metallizations, these metallizations could be designed substantially independently from the shape of the outlines of the polycrystalline silicon zones. However, configurations having a tendency to increase interference capacities should be avoided.

Numerous variations of the present invention can be foreseen. In particular, the mask 5 defining the parallel bars can also comprise an opening in the form of a frame substantially corresponding to the external polycrystalline silicon frame 9 in order to further increase the conduction between the bars, but in fact the conduction increase is small with respect to the complexity that this operation risks adding for the alignments of the successive masks. Furthermore, instead of oxide zone 15 separating parts 8 and 9 of the polycrystalline silicon layer, it is possible to foresee a removal of the polycrystalline silicon in the corresponding zones, but in the current manufacturing techniques, this other process presents the drawbacks of provoking the creation of steps that can be difficult to overcome for subsequent metallizations.

I claim:

1. A process for manufacturing a high-frequency vertical junction field effect transistor, the structure of which includes an embedded grid constituted by parallel bars, comprising the following steps:

successively depositing, on a silicon substrate, layers of first conductivity type silicon oxide of a first thickness, silicon nitride and resin and successively etching these layers so as to form an arrangement of parallel bars of silicon of the first conductivity type protected by nitride and resin;

implanting an impurity of a second type of conductivity type, different from the first conductivity type, masked by the three above-described layers, with an energy such that this impurity is implanted at a certain depth within the substrate and forms parallel implanted bars having said second type of conductivity;

removing the resin;

growing a silicon oxide layer at low temperature between the bars of silicon of the first conductivity type of protected by silicon nitride, this second oxide layer being thicker than the first and contacting the implanted bars of the second type of conductivity;

exposing the ends of the bars of the second type of conductivity, removing the silicon nitride and etching the silicon oxide to a thickness corresponding to the first thickness;

depositing a polycrystalline silicon layer;

separating the polycrystalline silicon layer into first and second zones said first zone being partly in contact with said first conductivity type silicon substrate but not in contact with the ends of said second conductivity type bars, said second zone being doped according to said first conductivity type, said second zone being partly in contact with the ends of the bars of the second type of conductivity but not in contact with the first conductivity type silicon substrate, said second zone being doped with the second type of conductivity.

2. A process according to claim 1, wherein the separating step comprises the step of separating the polycrystalline silicon layer into two zones by oxidizing the polycrystalline silicon layer between the first and second zones.

3. A process according to claim 1, wherein the exposure of the ends of the bars of the second type of conductivity is ensured by depositing a resin layer open along at least one strip perpendicular to the direction of the bars and by subjecting the structure to a selective etching of silicon oxide where it is not covered by silicon nitride or resin.

* * * * *